(12) United States Patent
Wu et al.

(10) Patent No.: US 10,446,602 B2
(45) Date of Patent: Oct. 15, 2019

(54) SENSOR DEVICE

(71) Applicant: InnoLux Corporation, Miao-Li County (TW)

(72) Inventors: Chih-Hao Wu, Miao-Li County (TW); Li-Wei Sung, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 0 days.

(21) Appl. No.: 15/943,731

(22) Filed: Apr. 3, 2018

(65) Prior Publication Data
US 2018/0308981 A1 Oct. 25, 2018

(30) Foreign Application Priority Data

Apr. 24, 2017 (CN) .......................... 2017 1 0272096
Jun. 29, 2017 (CN) .......................... 2017 1 0530379

(51) Int. Cl.
*H01L 27/146* (2006.01)
*H01L 29/786* (2006.01)

(52) U.S. Cl.
CPC .... *H01L 27/14658* (2013.01); *H01L 29/7869* (2013.01); *H01L 29/78696* (2013.01); *H01L 27/14612* (2013.01)

(58) Field of Classification Search
CPC ........ H01L 27/1214–27/1296; H01L 27/1225; H01L 27/14658–27/14663; H01L 29/7869; H01L 29/786–29/78696
See application file for complete search history.

(56) References Cited

U.S. PATENT DOCUMENTS

| 2002/0053946 | A1 | 5/2002 | Huang | |
| 2006/0108529 | A1* | 5/2006 | Saito | H01L 27/14601 250/338.4 |
| 2008/0302969 | A1 | 12/2008 | Jung | |
| 2010/0320391 | A1* | 12/2010 | Antonuk | H01L 27/1462 250/366 |
| 2011/0140100 | A1 | 6/2011 | Takata | |
| 2011/0163241 | A1* | 7/2011 | Jung | H04N 5/32 250/371 |
| 2013/0037794 | A1 | 2/2013 | Chen | |
| 2016/0027827 | A1* | 1/2016 | Sekine | H01L 27/14612 250/370.09 |

* cited by examiner

Primary Examiner — Eric A. Ward
(74) Attorney, Agent, or Firm — Winston Hsu

(57) ABSTRACT

A sensor device is provided and includes a first transistor, a second transistor, a third transistor, and a photosensor. The first transistor has a first gate, a first drain, and a first source. The first drain is coupled to a first power line and has a concave surface, and the first source is disposed corresponding to the concave surface. The second transistor has a second source, coupled to the first gate. The third transistor has a third gate, a third drain, and a third source, the third drain is coupled to the first source, the third source is coupled to the data line, and the third gate is coupled to the readout line. The photosensor is coupled to the first gate.

22 Claims, 15 Drawing Sheets

SENSOR DEVICE

BACKGROUND OF THE DISCLOSURE

1. Field of the Disclosure

The present disclosure relates to a sensor device, and more particularly, to a sensor device utilizing an asymmetric transistor.

2. Description of the Prior Art

With the advanced technology, applications of sensor device are getting wider. One of the most attractive applications is to detect X-ray. Because of having advantages of low radiation dose, rapid electronic imaging, and easy inspection, remake, capture, transfer and analysis to the image, the digital sensor device gradually replaces the traditional method that uses screen film to form an X-ray radiogram. Current digital sensor device uses photodiodes as its photosensor. Since the harm of the X-ray to the human body is accumulated, to reduce the X-ray irradiation dose in examination is the best way to prevent the human body from receiving over large X-ray irradiation amount. However, X-ray irradiation dose is difficult to be reduced due to the limit of the signal to noise ratio (SN ratio) of the digital sensor device. Accordingly, to increase the SN ratio of the sensor device is still an objective that needs to be achieved in this field.

SUMMARY OF THE DISCLOSURE

It is therefore an objective of the present disclosure to provide a sensor device to increase the SN ratio or detection accuracy.

An embodiment of the present disclosure provides a sensor device including a readout line, a data line, a first power line, and a sensor unit. The sensor unit includes a first transistor, a second transistor, a third transistor, and a photosensor. The first transistor has a first gate, a first drain, and a first source, wherein the first drain is coupled to the first power line, the first drain has a concave surface, and the first source is disposed corresponding to the concave surface. The second transistor has a second gate, a second drain, and a second source, wherein the second source is coupled to the first gate. The third transistor has a third gate, a third drain, and a third source, wherein the third drain is coupled to the first source, the third source is coupled to the data line, and the third gate is coupled to the readout line. The photosensor is coupled to the first gate.

Another embodiment of the present disclosure provides a sensor device including a readout line, a data line, a first power line, and a sensor unit. The sensor unit includes a first transistor, a second transistor, a third transistor, and a photosensor. The first transistor has a first gate, a first drain, a first source, and a semiconductor layer, wherein the first drain is coupled to the first power line. The second transistor has a second gate, a second drain, a second source, and a second semiconductor layer, wherein the second source is coupled to the first gate. The third transistor has a third gate, a third drain, a third source, and a third semiconductor layer, wherein the third drain is coupled to the first source, the third source is coupled to the data line, and the third gate is coupled to the readout line. The photosensor is coupled to the first gate. At least one of the first semiconductor layer, the second semiconductor layer and the third semiconductor layer includes poly-silicon, and at least another one of the first semiconductor layer, the second semiconductor layer and the third semiconductor layer includes oxide semiconductor or amorphous silicon.

Another embodiment of the present disclosure provides a sensor device including a readout line, a data line, a first power line, and a sensor unit. The sensor unit includes a first transistor, a second transistor, a third transistor, and a photosensor. The first transistor has a first gate, a first drain, a first source, and a semiconductor layer, wherein the first drain is coupled to the first power line. The second transistor has a second gate, a second drain, a second source, and a second semiconductor layer, wherein the second source is coupled to the first gate. The third transistor has a third gate, a third drain, a third source, and a third semiconductor layer, wherein the third drain is coupled to the first source, the third source is coupled to the data line, and the third gate is coupled to the readout line. The photosensor is coupled to the first gate. At least one of the first semiconductor layer, the second semiconductor layer and the third semiconductor layer includes oxide semiconductor.

These and other objectives of the present disclosure will no doubt become obvious to those of ordinary skill in the art after reading the following detailed description of the embodiment that is illustrated in the various figures and drawings.

DETAILED DESCRIPTION

To provide a better understanding of the present disclosure, exemplary embodiments will be detailed as follows. The exemplary embodiments of the present disclosure are illustrated in the accompanying drawings to elaborate the contents and effects to be achieved. The exemplary embodiments are not intended to limit the scope of the present disclosure. It will be understood that when the terms "comprise" and/or "have" are used in the present disclosure, the referred feature, region, step, operation and/or device exist, but not exclude the existence or addition of one or plural feature, region, step, operation and/or device. It will be also understood that when an element is referred to as being "on" or extended "onto" another element (or its variant), it can be directly on or directly extended onto another element, or intervening elements may be presented. In contrast, when an element is referred to as being "directly on" or "directly" extended "onto" another element (or its variant), there are no intervening elements presented. It will be also understood that when an element is referred to as being "coupled" to another element (or its variant), it can be directly connected to another element or indirectly connected to, such as electrically connected to, another element through one or plural element.

In the present disclosure, flow of electrons in one transistor are from its source to its drain, the electrons can be flowed in the channel of the transistor through applying a voltage to the gate of the transistor, and the electrons stored in the source of the transistor can be flowed to the drain of the transistor through the channel.

Figure 1:
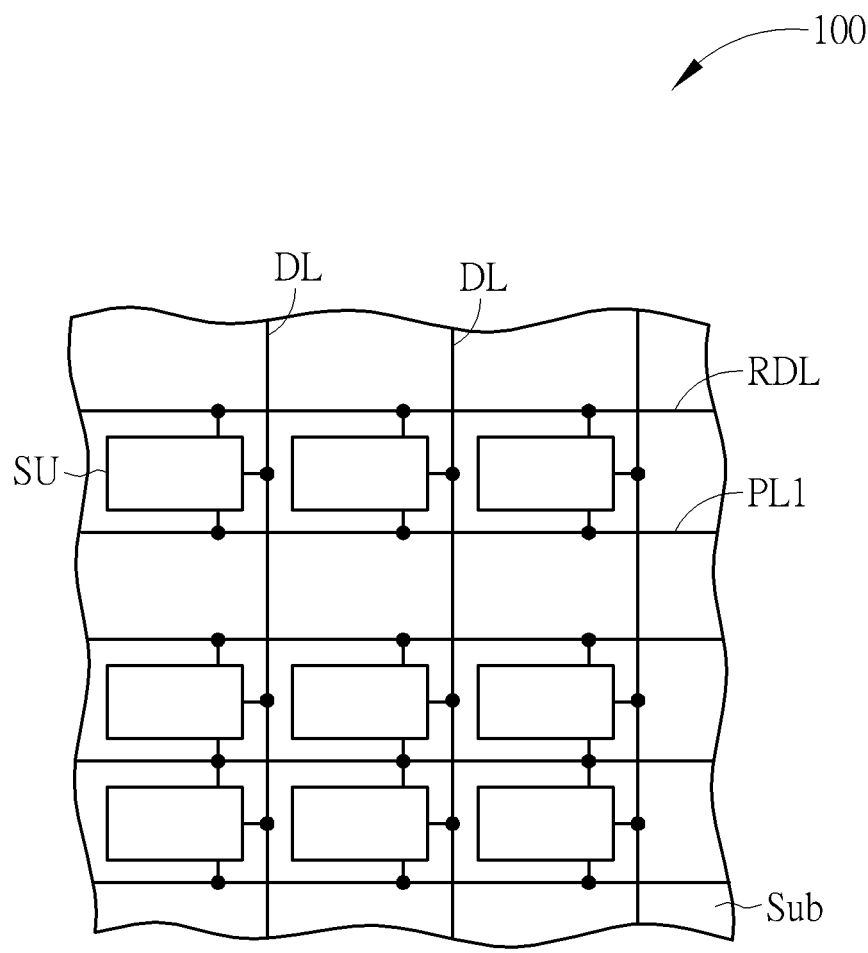
FIG. 1 is a schematic diagram illustrating a top view of a sensor device according to a first embodiment of the disclosure.

Please refer to FIG. 1, which is a schematic diagram illustrating a top view of a sensor device according to a first embodiment of the disclosure. The sensor device 100 includes a substrate Sub, at least one sensor unit SU, at least one data line DL, at least one readout line RDL, and at least one first power line PL1. The sensor unit SU used to detect light intensity is coupled to the data line DL, the readout line RDL and the first power line PL1. In this embodiment, the sensor device 100 may include a plurality of sensor units SU arranged in an array, so as to detect an image corresponding to lights with different intensities. The lights may be for example X-ray, ultraviolet, visible light or infrared ray. Accordingly, number of the data lines DL, number of the readout lines RDL and number of the first power line PL1 may be a plural, respectively. Each data line DL may be coupled to the sensor units SU in a same column, and each readout line RDL may be coupled to the sensor units SU in a same row, but the present disclosure is not limited herein. In this embodiment, the material of the substrate Sub may be glass. In another embodiment, the material of the substrate Sub may be plastic, resin, metal or other material suitable for the substrate. In this embodiment, each sensor unit SU may be a diode device, such as a photodiode. In another embodiment, each sensor unit SU may be a transistor device or other electronic device suitable for detecting the light. In this embodiment, the material of the data line DL, the material of the readout line RDL and the material of the first power line PL1 may be metal. In another embodiment, the material of the data line DL, the material of the readout line RDL and the material of the first power line PL1 may be conductive metal oxide (e.g., ITO or IZO), other conductive material, or a single layer or multilayer structure thereof.

Figure 2:
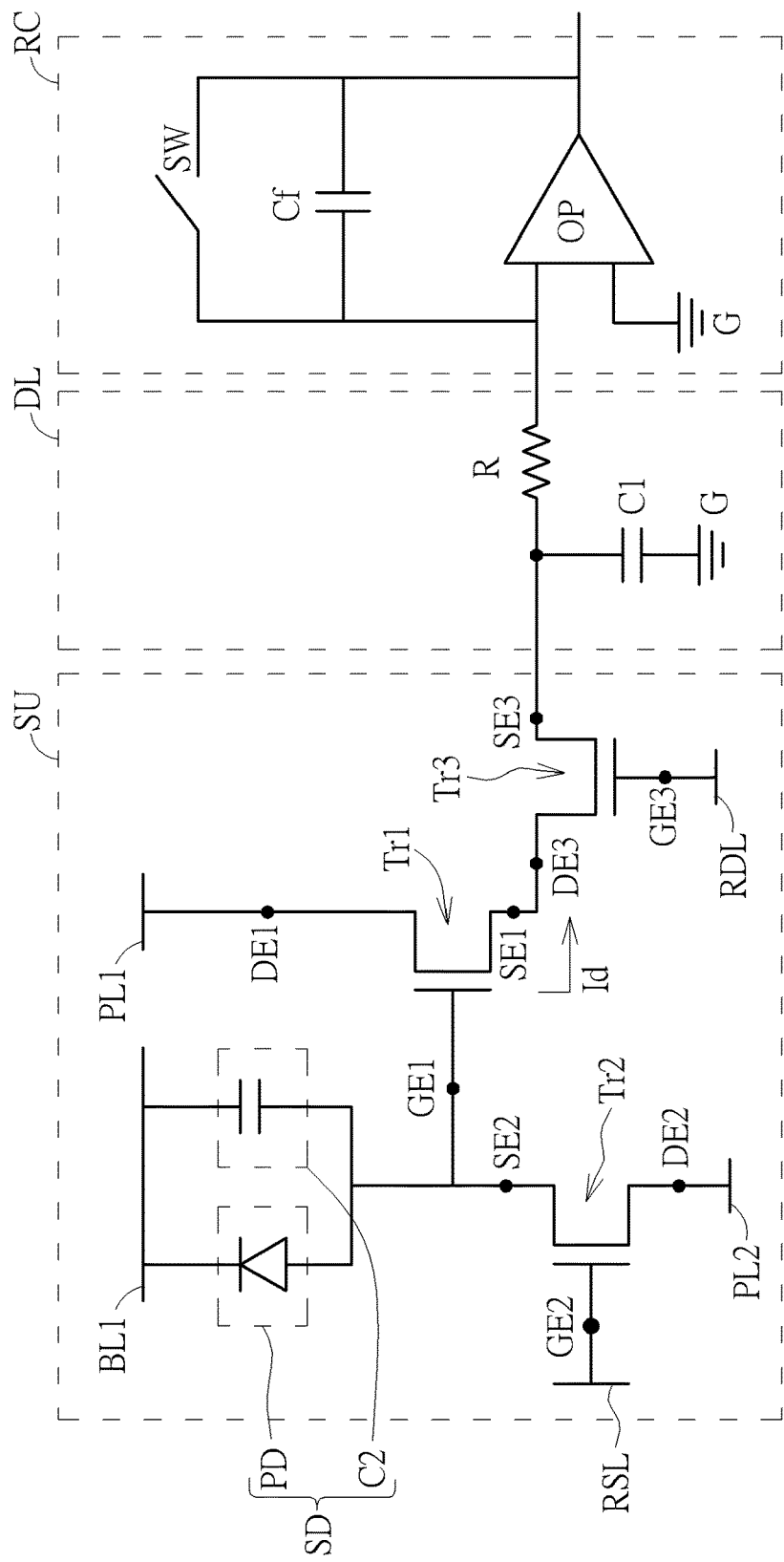
FIG. 2 is a circuit diagram illustrating one sensing unit, one data line and one readout circuit according to the first embodiment of the present disclosure.

Please refer to FIG. 2, which is a circuit diagram illustrating one sensing unit, one data line and one readout circuit according to the first embodiment of the present disclosure. Each sensing unit SU of this embodiment may include a first transistor Tr1, a second transistor Tr2, a third transistor Tr3, and a photosensor SD. The material of the semiconductor layer of the first transistor Tr1, the material of the semiconductor layer of the second transistor Tr2 and the material of the semiconductor layer of the third transistor Tr3 may be amorphous silicon, poly-silicon (e.g., LTPS) or oxide semiconductor, such as InGaZnO (IGZO). The first transistor Tr1 is used to enlarge light signal sensed by the photosensor SD. The first transistor Tr1 has a first gate GE1, a first drain DE1 and a first source SE1, and a first end (anode) of the photosensor SD is coupled to the first gate GE1. When the photosensor SD is irradiated by the light and absorbs the light to generate electric charges through photoelectric effect, the electric charges accumulate in the first gate GE1, so as to change the voltage in the first gate GE1, thereby altering the drain current Id between the first drain DE1 and the first source SE1 of the first transistor Tr1 and amplifying the voltage signal of the first gate GE1. For this reason, through the current change, the amount of the electric charges generated from irradiating the photosensor SD by the light can be measured. The first transistor Tr1 needs to be operated in the saturation region in order to amplifying the voltage signal of the first gate GE1. In other words, the first drain DE1 is coupled to the first power line PL1 for providing a first voltage, and a voltage difference of the voltage of the first gate GE1 subtracting the first voltage is less than the threshold voltage of the first transistor Tr1. In the present disclosure, an electrode of the transistor electrically connected to the power line without through its channel is called the drain.

The second transistor Tr2 is used to reset the voltage of the first gate GE1 to be in a start state, so as to sense the light through the photosensor SD again. The second transistor Tr2 has a second gate GE2, a second drain DE2 and a second source SE2, and the second source SE2 is coupled to the first gate GE1. In this embodiment, the sensor device 100 may further include a reset line RSL and a second power line PL2. The reset line RSL is coupled to the second gate GE2 and used to control the reset to the voltage of the first gate GE1. The second drain DE2 is coupled to the second power line PL2 for providing a second voltage, so that the second voltage can be used to reset the voltage of the first gate GE1 to the start state. Since the second voltage is less than the first voltage, the first transistor Tr1 can still operate in the saturation region after resetting the voltage of the first gate GE1. In the present disclosure, an electrode of the transistor electrically connected to the power line without through its channel is called the drain.

The third transistor Tr3 is used as a readout transistor and used to control the output of the current of the first transistor Tr1. The third transistor Tr3 has a third gate GE3, a third drain DE3 and a third source SE3. The third drain DE3 is coupled to the first source SE1, the third source SE3 is coupled to the corresponding data line D1, and the third gate GE3 is coupled to the corresponding readout line RDL. Through the readout line RDL, the third transistor Tr3 can be turned on and operates in a linear region, so as to output the drain current Id of the first transistor Tr1 to the data line DL.

In this embodiment, the data line DL extends from a sensing region to a peripheral region and is coupled to a readout circuit RC in the peripheral region or outside the sensor device 100, and accordingly, the current of the first transistor Tr1 can be output to the readout circuit RC through the data line DL. Since the data line DL is capacitively coupled to a ground end G and has a specific resistance, the data line DL can include a first parasitic capacitor C1 and a parasitic resistor R. The first parasitic capacitor C1 exists (coupled) between the data line DL and the ground end G, and the parasitic resistor R exists (coupled) between the third gate GE3 and the readout circuit RC. Furthermore, the readout circuit RC may for example include an operational amplifier OP and a feedback capacitor Cf. For example, an input end of the operational amplifier OP may be coupled to the data line DL, and another end of the operational amplifier OP may be coupled to the ground end G. The feedback capacitor Cf is coupled between an output end of the operational amplifier OP and the data line DL. The readout circuit RC may further include a switch SW coupled to the feedback capacitor Cf in parallel.

Figure 3:
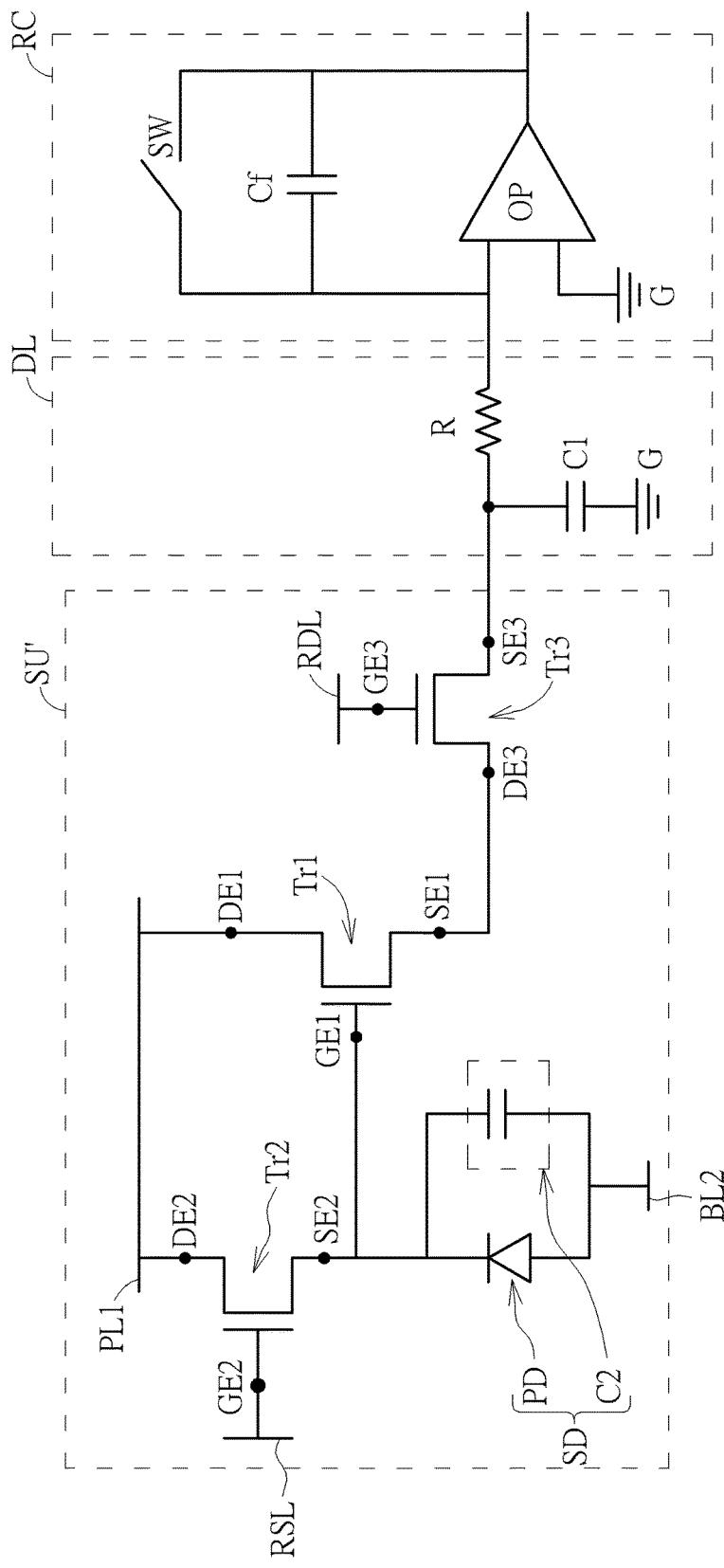
FIG. 3 is a circuit diagram illustrating one sensing unit, one data line and one readout circuit according to another embodiment of the present disclosure.

Each photosensor SD may include a photodiode PD, which has an anode (first electrode) and a cathode (second electrode). For example, the photodiode PD may have a PIN structure, but not limited thereto. The photodiode PD can be made of different materials based on different absorption wavelengths, for example the photodiode PD may include silicon for detecting X-ray. In order to perform photoelectric conversion, the photodiode PD needs to be operated in a reverse bias state. In this embodiment, the anode (first electrode) is coupled to the first gate GE1, the cathode (second electrode) is coupled to the bias line BL1, and the voltage provided by the bias line BL1 is greater than the second voltage, so that the photodiode PD can be operated in the reverse bias state, but the present disclosure is not limited herein. In another embodiment, the cathode (second electrode) may be coupled to the first gate GE1, and the anode (first electrode) may be coupled to the first power line PL1. In another embodiment, the cathode (second electrode) may be coupled to the first power line PL1. In another embodiment, anode (first electrode) may be coupled to the first power line PL1. In the sensor unit SU' of another embodiment as shown in FIG. 3, the second drain DE2 may be coupled to the first power line PL1, the cathode (second electrode) of the photodiode PD is coupled to the first gate GE1, and the anode (first electrode) of the photodiode PD is coupled to another bias line BL2 providing a voltage less than the first voltage. In another embodiment, the anode (first electrode) of the photodiode PD is coupled to the first gate GE1, and the cathode (second electrode) is coupled to another bias line BL2 providing a voltage less than the first voltage. Moreover, since the photodiode PD needs to be operated in the reverse bias state, each photosensor SD may further include a second parasitic capacitor C2 equivalent to the parasitic capacitor while the photodiode PD is operated in the reverse bias state. The disposition relationship between the photosensor SD and the first transistor Tr1, the second transistor Tr2 and the third transistor Tr3 may be designed based on the requirements. For example, viewing from a normal direction perpendicular to a surface of the substrate Sub (top view direction), the photosensor SD may overlap or cover the first transistor Tr1, the second transistor Tr2 and the third transistor Tr3, overlap at least a part of the first transistor Tr1, the second transistor Tr2 and the third transistor Tr3, or doesn't overlap the first transistor Tr1, the second transistor Tr2 and the third transistor Tr3, but not limited thereto.

Figure 4:
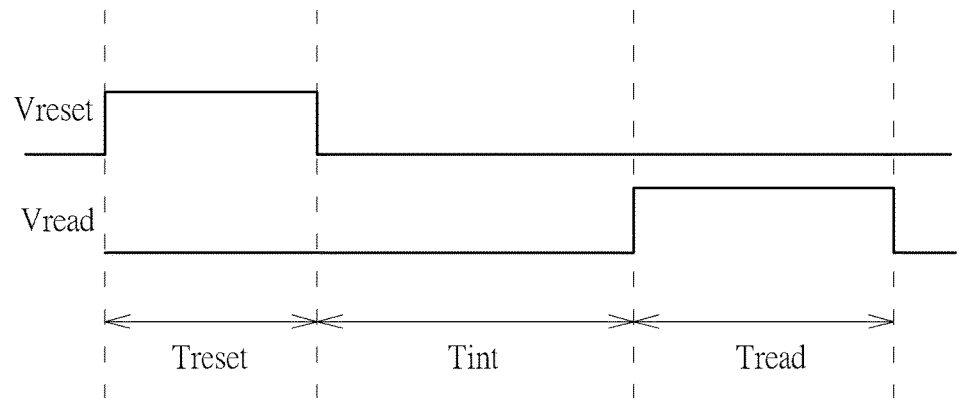
FIG. 4 is a schematic sequence diagram illustrating an operation of one sensor unit.

Please refer to FIG. 4, which is a schematic diagram illustrating an operational sequence of one sensor unit. As shown in FIG. 4, a sensing action of each sensor unit SU may include three periods, which respectively are a reset period Treset, an integral period Tint and a readout period Tread. In the reset period Treset, the reset line RSL provides a reset voltage Vreset to turn on the second transistor Tr2, so that the voltage of the first gate GE1 is the second voltage of the second power line PL2. Then, in the integral period Tint, providing the reset voltage Vreset is stopped to turn off the second transistor Tr2, and the photosensor SD can detect the light, so that the electric charges can accumulate in the first gate GE1. Also, the accumulated electric charges can be converted into the drain current Id through the first transistor Tr1. After that, in the readout period Tread, the readout line RDL provides a readout voltage Vread to turn on the third transistor Tr3, so that the drain current Id enters the data line DL and is output to the readout circuit RC. Thus, the amount of the electric charges generated from the photosensor SD in a specific time can be measured.

Figure 5:
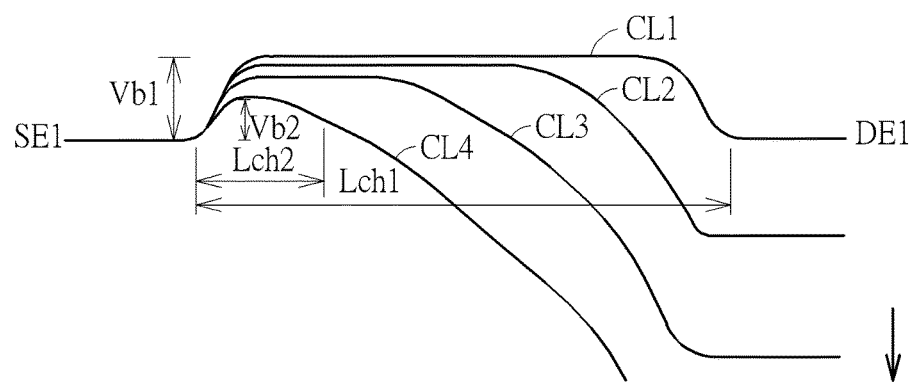
FIG. 5 is a schematic diagram illustrating energy level curves between the first source and the first drain when the voltage differences between the first drain and the source are different and the voltage difference between the first gate and the first source of the first transistor is zero.

In this embodiment, since one first power line PL1 and one readout line RDL are coupled to the sensor units SU in the same row, the readout voltage provided from the readout line RDL is used to turn on the third transistors Tr3 of the sensor units SU in the same row at the same time in the readout period Tread. For this reason, the first transistors Tr1 in the same row require outputting the drain currents Id to the data lines DL at the same time. Accordingly, an obvious load effect is generated in each first power line PL1 connected to the first transistors Tr1 in the same row, so that the first voltages provided by the first power line PL1 to different first transistors Tr1 are different. Basically, when the channel of the first transistor Tr1 is turned on to allow the electrons flowing because of the gate voltage, the electrons can flow from the first source SE1 to the first drain DE1, and the electrons stored in the first source SE1 can pass over the energy barrier to reach the first drain DE1. In the present disclosure, an electrode of the transistor electrically connected to the power line without through its channel is called the drain. Please further refer to FIG. 5, which is a schematic diagram illustrating energy level curves between the first source and the first drain when the voltage differences between the first drain and the source are different and the voltage difference between the first gate and the first source of the first transistor is zero. Curves CL1-CL4 respectively represent the energy levels between the first source and the first drain when the voltage difference between the first drain and the first source is gradually increased. Taking the curves CL1 and CL4 as an example, when the voltage differences between the first source SE1 and the first drain DE1 are increased toward the direction shown by the arrow, not only the channel barrier Vb1 of the semiconductor layer of the first transistor Tr1 is reduced to be a channel barrier Vb2, but also an effective channel length Lch1 of the first transistor Tr1 is reduced to be an effective channel length Lch2, which is so-called short channel effect. In other words, when the first voltage of the first drain DE1 is changed, the effective channel length of the semiconductor layer of the first transistor Tr1 is changed accordingly.

Figure 6A:
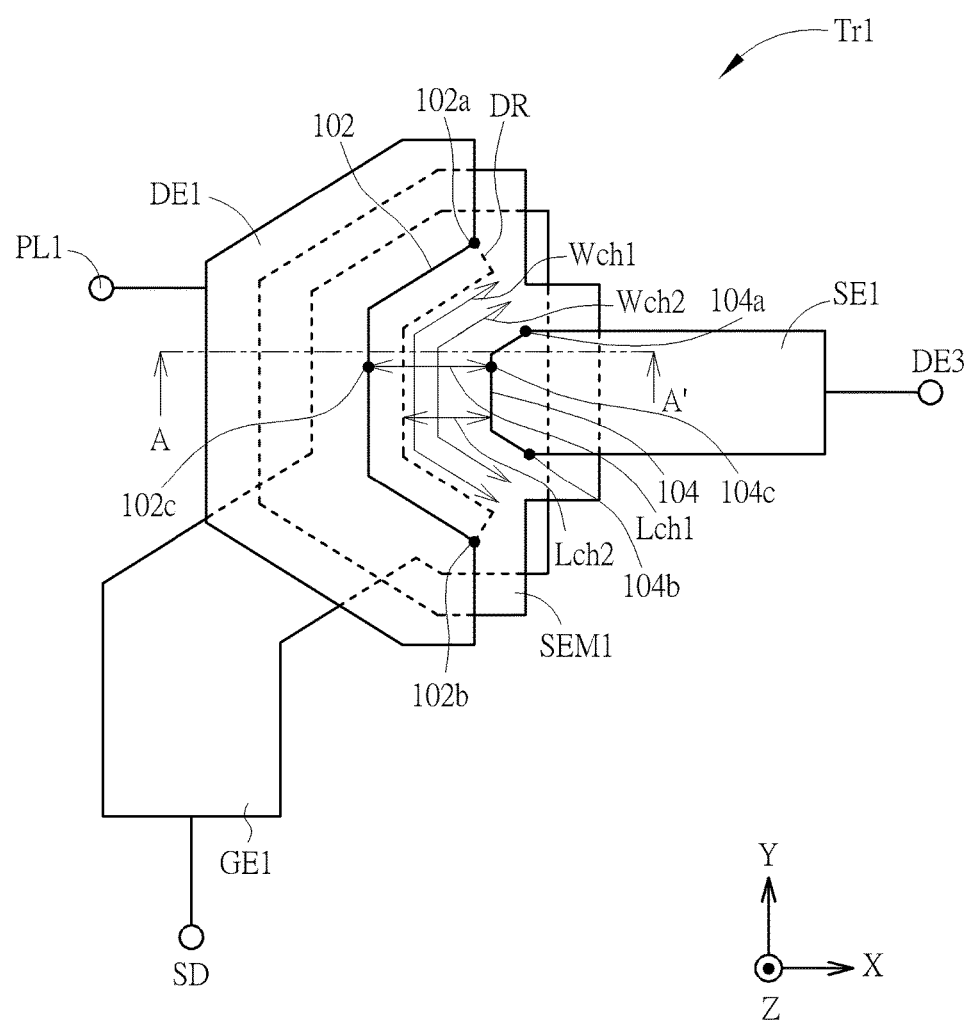
FIG. 6A is a schematic diagram illustrating a top view of the first transistor according to the first embodiment of the present disclosure.
Figure 7A:
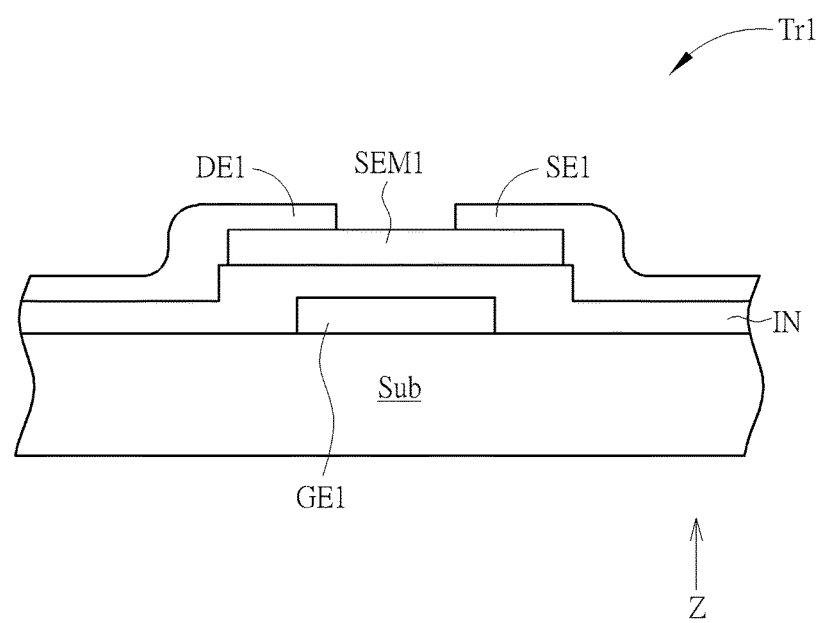
FIG. 7A is a schematic diagram illustrating a cross-sectional view taken along a cross-sectional line A-A' of FIG. 6A.

Please refer to FIG. 6A and FIG. 7A. FIG. 6A is a schematic diagram illustrating a top view of the first transistor according to the first embodiment of the present disclosure, FIG. 7A is a schematic diagram illustrating a cross-sectional view taken along a cross-sectional line A-A' of FIG. 6A. As shown FIG. 6A and FIG. 7A, the first drain DE1 of this embodiment has a concave surface 102 (also called concave part having a concave region with an open shape), and the first source SE1 is disposed corresponding to the concave surface 102. For example, the first source SE1 may have a convex surface 104 (also called convex part having a convex region), and the convex surface 104 corresponds the concave surface 102. In this embodiment, the concave surface 102 and the convex surface 104 have shapes substantially corresponding to each other. In a top view direction Z perpendicular to the substrate Sub, the concave surface 12 and the convex surface 104 may respectively have a pattern without arc shape, a pattern with part of arc shape or a pattern with whole arc shape, but not limited thereto. A first end 102a and a second end 102b of the concave surface 102 are respectively a start point and an end point of a concave surface trace corresponding to the convex surface 104. In contrast thereto, the first end 104a and the second end 104b are respectively a start point and an end point of a convex surface trace corresponding to the concave surface 102. Gaps between each part of the concave surface 102 and its corresponding part of the convex surface 104 are substantially equal to each other. But, the parts close to the two ends or the central part may be slightly wider or narrower for the reason of the photolithographic process or the designed pattern, but not limited thereto. In the top view direction Z, a concave surface length of the concave surface 102 from the first end 102a through the concave surface trace to the second end 102b is greater than a convex surface length of the convex surface 104 from the first end 104a through the convex surface trace to the second end 104b. The channel region is in a region surrounded by the first end 102a, the first end 104a, the second end 102b and the second end 104b. In the top view direction Z, the channel length Lch may be a gap between the first end 102a and the first end 104a, a gap between the second end 102b and the second end 104b, or a gap between a top 104c of the convex surface 104 and a bottom 102c of the concave surface 102, in which the top 104c is between the first end 104a and the second end 104b, and the bottom 102c is between the first end 102a and the second end 102b. In the top view direction Z, the channel width Wch may be a half of a sum of the concave surface length of the concave surface 102 and the convex surface length of the convex surface 104, or a length of a cross-sectional line in the center of the channel region from the first end to the second end. In other words, the first transistor Tr1 of this embodiment is an asymmetric transistor. It should be noted that since the first drain DE1 are coupled to the first power line PL1, the voltage of the first drain DE1 is greater than the voltage of the first source SE1. Accordingly, when the first transistor Tr1 has the short channel effect, the depletion region DR near the first drain DE1 is expanded from the first drain DE1 to the first source SE1, thereby shrinking the original channel length Lch1 to be the channel length Lch2. At the same time, since the first drain DE1 has the concave surface 102, the channel width Wch1 between the first drain DE1 and the first source SE1 is reduced to be the channel width Wch2. A current-voltage formula (1) of the first transistor Tr1 operating in the saturation region in light of the channel length modulation phenomenon is shown as follow:

$$Id = \frac{\mu Cox}{2} \frac{Wch}{Lch}(Vg - Vth)^2(1 + \lambda Vd), \quad (1)$$

where Id is value of the drain current, µ is value of carrier mobility in the channel region, Cox is value of a capacitance of the gate oxide layer, Lch is value of the channel length, Wch is value of the channel width, Vg is value of the gate voltage, Vth is value of the threshold voltage, Vd is value of the drain voltage, and λ is a parameter. As seen from the formula (1), the drain current Id is not only inversely proportional to the channel length but also directly proportional to the channel width, so through designing the first transistor Tr1 to be the asymmetric transistor structure and coupling the first drain DE1 to the first power line PL1 with higher voltage in this embodiment, the channel width of the first transistor Tr1 can be shrunk to mitigate the influence of the short channel effect on the current of the first transistor Tr1 while the channel length of the first transistor Tr1 is reduced. Accordingly, although the first voltages provided to different first transistors Tr1 are different, through the design of the first transistor Tr1 in this embodiment, the changes of the drain currents Id of the first transistors Tr1 resulted from the different first voltages can be effectively mitigated, thereby increasing the detection uniformity and accuracy of the sensor device 100 or raising the SN ratio of the sensor device 100.

Figure 6B:
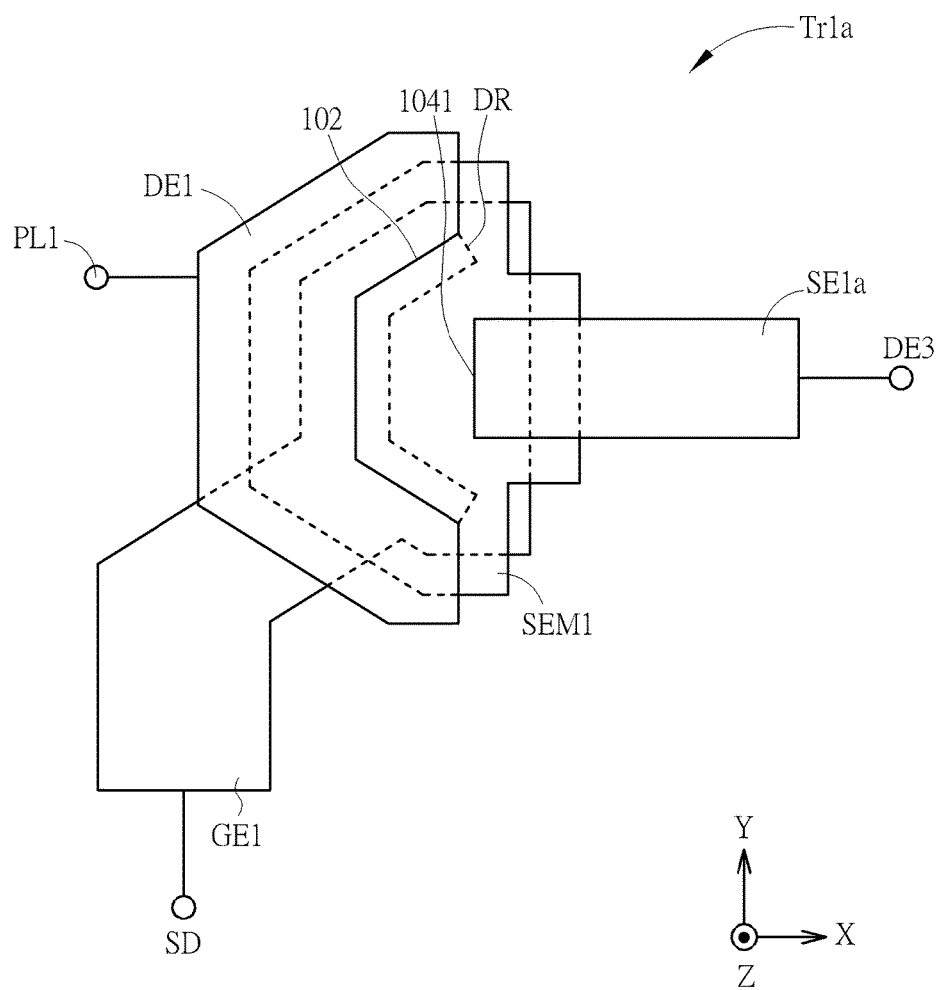
FIG. 6B is a schematic diagram illustrating a top view of a first transistor according to another embodiment of the present disclosure.
Figure 6C:
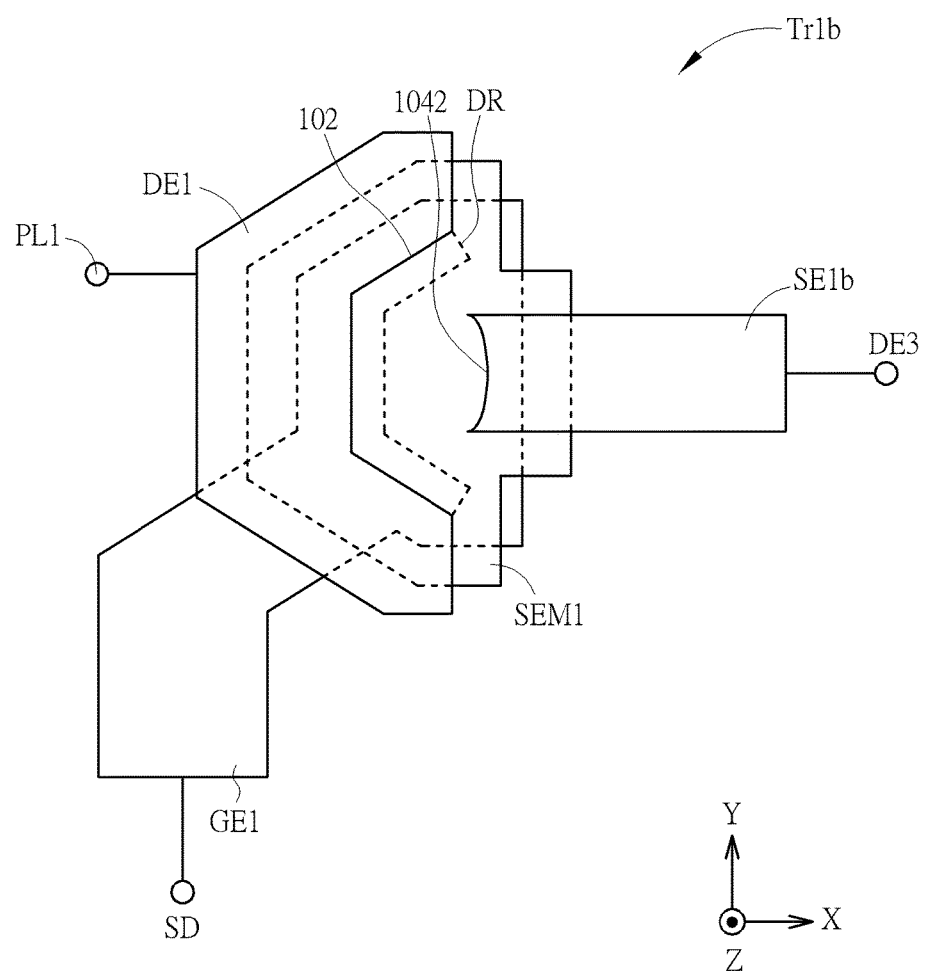
FIG. 6C is a schematic diagram illustrating a top view of a first transistor according to another embodiment of the present disclosure.

In a first transistor Tr1a according to another embodiment as shown in FIG. 6B, the surface of the first source SE1a corresponding to the concave surface 102 may be a flat surface 1041 (without convex region and concave region). In a first transistor Tr1b according another embodiment as shown in FIG. 6C, the surface of the first source SE1b corresponding to the concave surface 102 may be a concave surface 1042 (also called concave part having a concave region with an open shape), the shape of the concave surface 1042 in the top view direction Z perpendicular to the substrate Sub may be for example an arc or other geometric shapes, and the concave surface 1042 may have a pattern without circular arc shape, a pattern with a circular arc part or a whole circular arc pattern, but not limited thereto.

Figure 8:
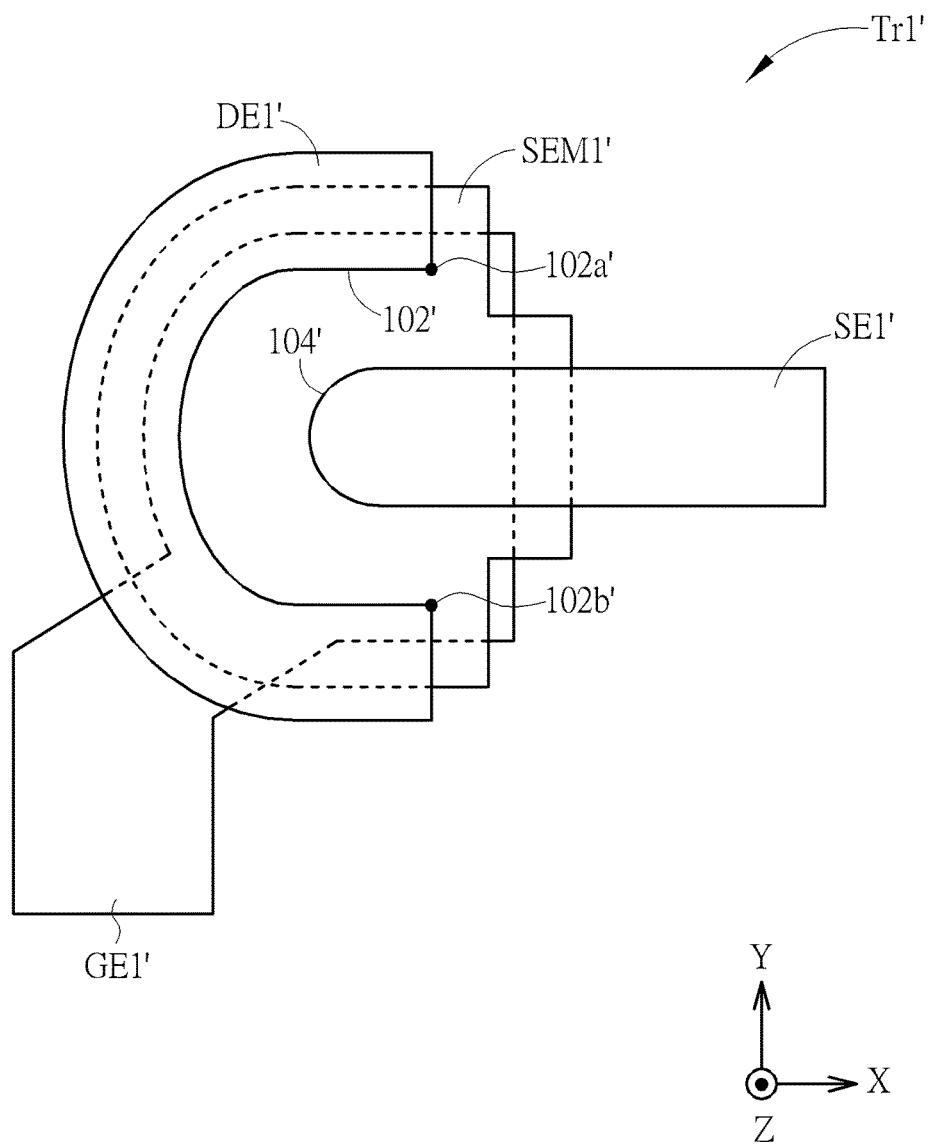
FIG. 8 is a schematic diagram illustrating a top view of a first transistor according to another embodiment of the present disclosure.

In this embodiment, the first source SE1 may extend along a direction X, the first drain DE1 and the first source SE1 do not overlap in a direction Y, and a top view shape of the concave surface 102 and a top view shape of the convex surface 104 may respectively be a trapezoid, but not limited thereto. In another embodiment, the first source SE1 may have a shift in the direction Y, such that a center of the surface of the first source SE1 facing the concave surface 102 in the direction Y and a center of the concave surface 102 in the direction Y are not aligned in the direction X. In another embodiment, the first source SE1 may be rotated, such that an extension direction of the first source SE1 is not parallel to the direction X and has an included angle with the direction X. In the first transistor Tr1' of another embodiment as shown in FIG. 8, the concave surface 102' of the first drain DE1' has a concave part that is a concave region with an open shape surrounded and formed by the first end 102a', the second end 102b' and the concave surface trace, and the first source SE1' is disposed in the corresponding concave part of the concave surface 102'. That is to say, in the top view direction Z perpendicular to the substrate Sub, the first source SE1' and the concave part of the concave surface 102 at least partially overlap each other in this embodiment. In another embodiment, in the top view direction Z perpendicular to the substrate Sub, the first source SE1' and the concave part of the concave surface 102' do not overlap each other. For example, the convex surface 104' of the first source SE1' is disposed in the corresponding concave part of the concave surface 102' of the first drain DE1'. Also, the top view shape of the convex surface 104' and the top view shape of the concave surface 102' may be for instance a U-shape respectively, and a uniform gap exists between the convex surface 104' and the concave surface 102', but not limited thereto. The top view shape of the convex surface 104' and the top view shape of the concave surface 102' may respectively be other shapes, such as a rectangular, semicircular or arc. In the top view direction Z perpendicular to the substrate Sub, at least a part of the convex surface 104' is an arc, and at least a part of the concave surface 102' is an arc.

Figure 9:
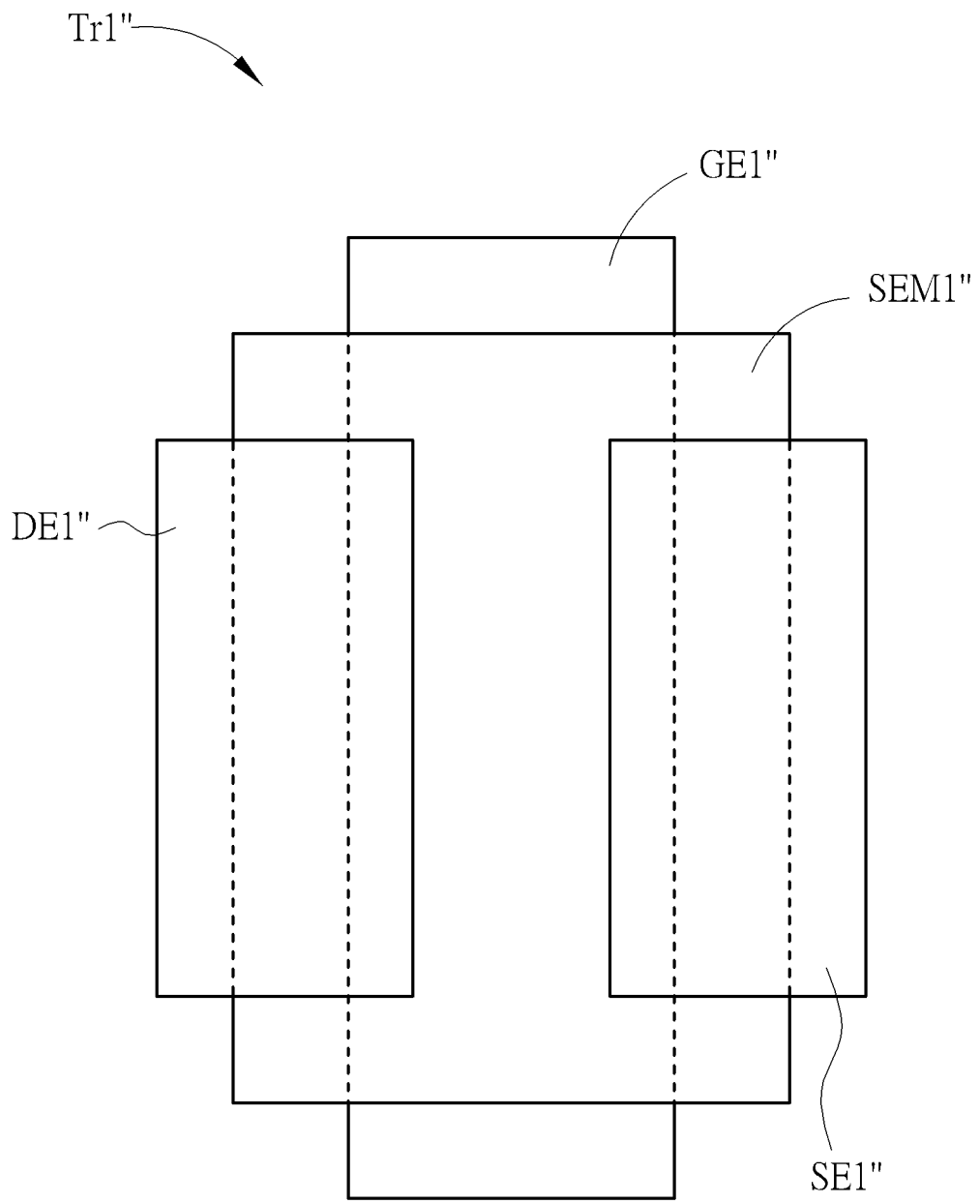
FIG. 9 is a schematic diagram illustrating a top view of a first transistor according to a comparative embodiment.
Figure 10:
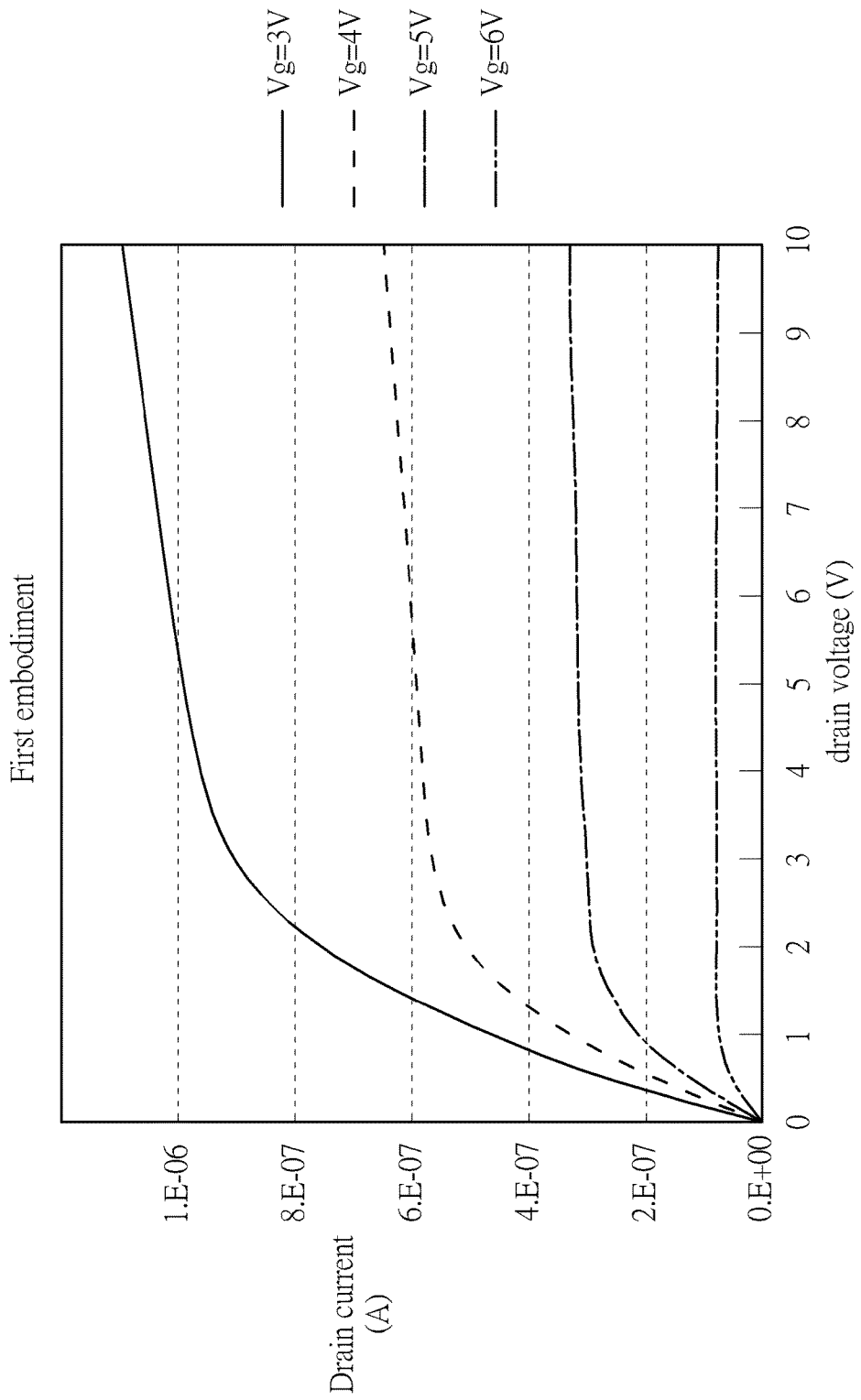
FIG. 10 and FIG. 11 are schematic diagrams illustrating relationships between the drain currents and the drain voltages of the first transistors according to the first embodiment and the comparative embodiment under different gate voltages respectively.
Figure 11:
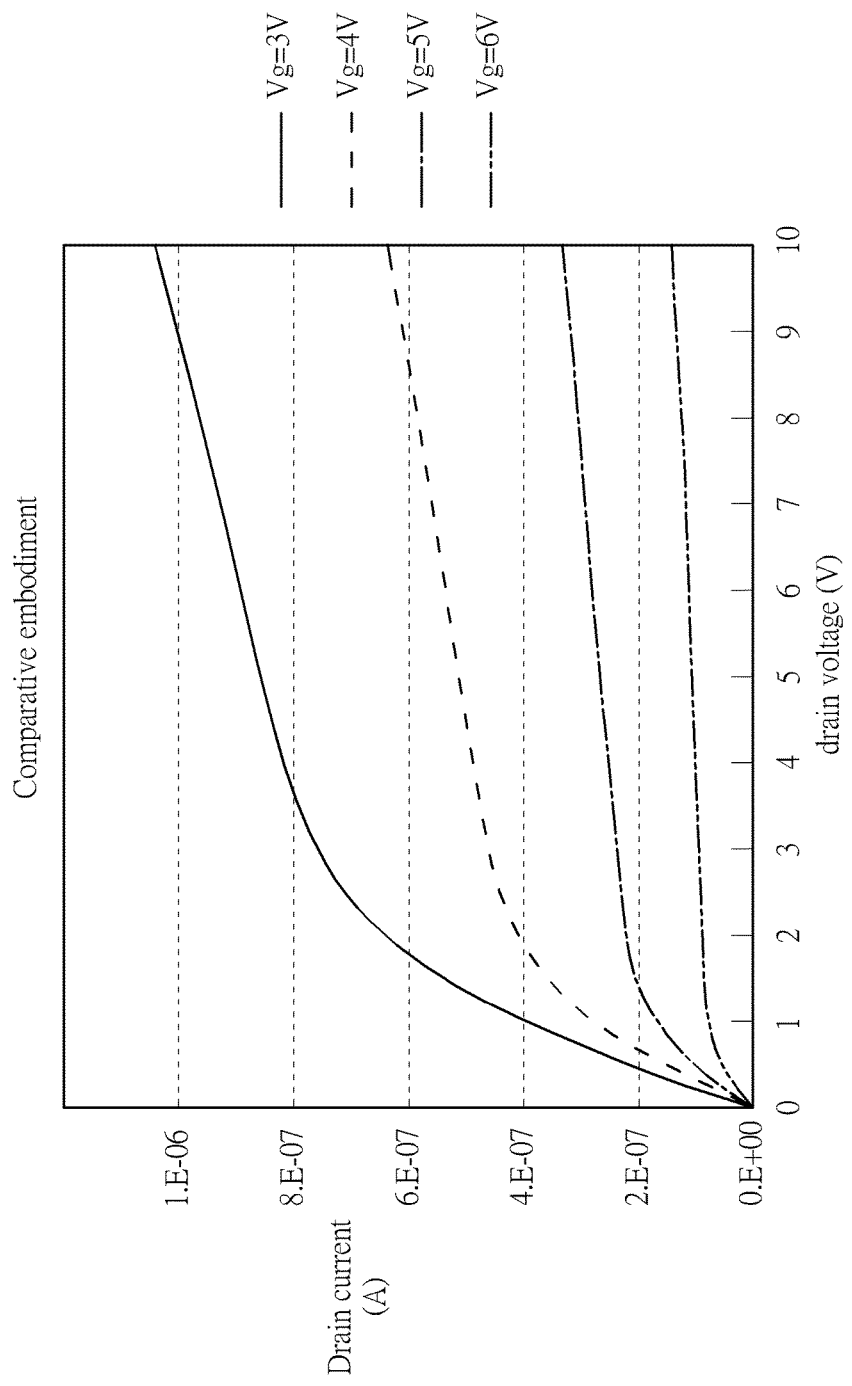

Please refer to FIG. 9 to FIG. 11. FIG. 9 is a schematic diagram illustrating a top view of a first transistor according to a comparative embodiment. FIG. 10 and FIG. 11 are schematic diagrams illustrating relationships between the drain currents and the drain voltages of the first transistors according to the first embodiment and the comparative embodiment under different gate voltages respectively. As shown in FIG. 9, the first transistor Tr1" of the comparative embodiment is a symmetric transistor. Specifically, the surface of the first drain DE1" of the first transistor Tr1" facing the first drain SE1" is parallel to the surface of the first source SE1" facing the first drain DE1". Notwithstanding the depletion region near the first drain DE1" is expanded from the first drain DE1" to the first source SE1" to change the channel length when the first transistor Tr1" has the short channel effect, the channel width of the first transistor Tr1" is not altered with the change of the channel length. Thus, the first transistor Tr1" of the comparative embodiment cannot effectively mitigate the short channel effect. As shown in FIG. 10 and FIG. 11, compared to the comparative embodiment, the slopes of the curves in the saturation region under different gate voltages Vg can be lower in the first transistor Tr1 of the first embodiment, which means the relationship between the drain current and the drain voltage can be significantly reduced, thereby mitigating the short channel effect.

Furthermore, please refer to FIG. 6A and FIG. 7A again. The first transistor Tr1 of this embodiment may further include a first semiconductor layer SEM1 and an insulation layer IN. The insulation layer IN is disposed between the first gate GE1 and the first semiconductor layer SEM1, and the first drain DE1 and the first source SE1 are disposed on the first semiconductor layer SEM1. Specifically, the first gate GE1 may be disposed between the first semiconductor layer SEM1 and the substrate Sub, which means the first transistor Tr1 may be a bottom gate type transistor, and the first semiconductor layer SEM1 may include for example oxide semiconductor or amorphous silicon, but not limited thereto. The oxide semiconductor may include for example InGaZnO (IGZO), but not limited thereto. In another embodiment, when the first transistor Tr1 is a bottom gate transistor, the first semiconductor layer SEM1 may include poly-silicon, such as low temperature poly-silicon. It should be noted that the first semiconductor layer SEM1 corresponding to the first drain DE1 and the first source SE1 is greater than a part of the first gate GE1 corresponding to the first drain DE1 and the first source SE1, such that a part of the first semiconductor layer SEM1 contacting the first drain DE1 protrudes from an outer side of the first gate GE1 in the top view direction perpendicular to the substrate Sub, and another part of the first semiconductor layer SEM1 contacting the first source SE1 protrudes from another outer side of the first gate GE1 in the top view direction Z perpendicular to the substrate Sub, so that the gate induced drain leakage (GIDL) can be reduced or prevented. In another embodiment, the first semiconductor layer SEM1 corresponding to the first drain DE1 and the first source SE1 may be less than the part of the first gate GE1 corresponding to the first drain DE1 and the first source SE1. In this embodiment, the second transistor Tr2 may be the symmetric transistor as shown in FIG. 9 or the asymmetric transistors as shown in FIG. 6A to FIG. 6C and FIG. 8, and the third transistor Tr3 may be the symmetric transistor as shown in FIG. 9 or the asymmetric transistors as shown in FIG. 6A to FIG. 6C and FIG. 8.

Figure 7B:
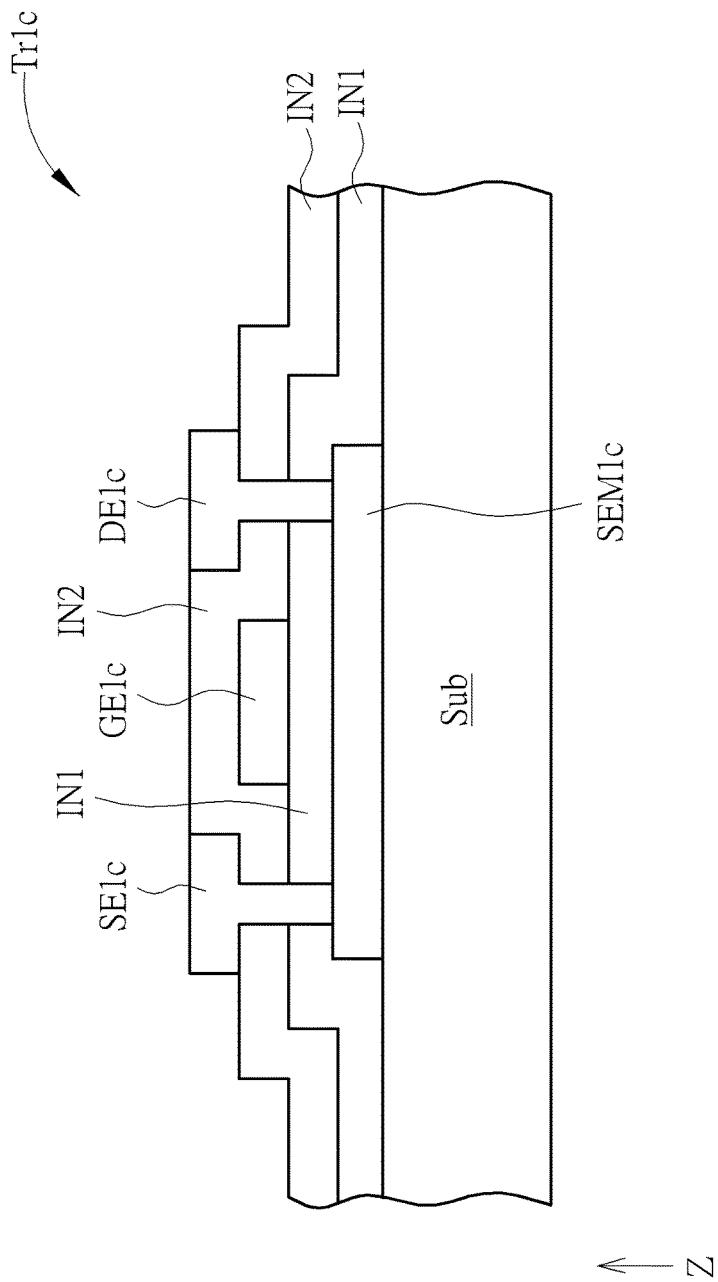
FIG. 7B is a schematic diagram illustrating a cross-sectional view of a first transistor according to another embodiment of the present disclosure.

In another embodiment, as shown in FIG. 7B, the first transistor Tr1*c* may be a top gate type transistor. The first semiconductor layer SEM1*c* may include for example polysilicon, but not limited thereto. Specifically, the first semiconductor layer SEM1*c* is disposed on the substrate Sub, the insulation layer IN1 is disposed on the first semiconductor layer SEM1*c*, the first gate GE1*c* corresponds the first semiconductor layer SEM1*c* and is disposed on the insulation layer IN1, and the insulation layer IN2 is disposed on the first gate GE1*c* and the insulation layer IN1. The insulation layer IN1 and the insulation layer IN2 have two through holes TH respectively corresponding to two parts of the first semiconductor layer SEM1*c*. The first source SE1*c* and the first drain DE1*c* are disposed on the insulation layer IN2 respectively and in contact with the first semiconductor layer SEM1*c* respectively through the corresponding through hole TH. In another embodiment, when the first transistor Tr1*c* is the top gate type transistor, the first semiconductor layer SEM1*c* may include for example oxide semiconductor or poly-silicon.

The sensor device is not limited by the aforementioned embodiment, and may have other different variant embodiments or embodiments. To simplify the description and make it easier to compare the difference between the first embodiment and other embodiments, the identical components in each of the following embodiments are marked with identical symbols as the first embodiment, and the following description will detail the dissimilarities among different embodiments and the identical features will not be redundantly described.

Figure 12:
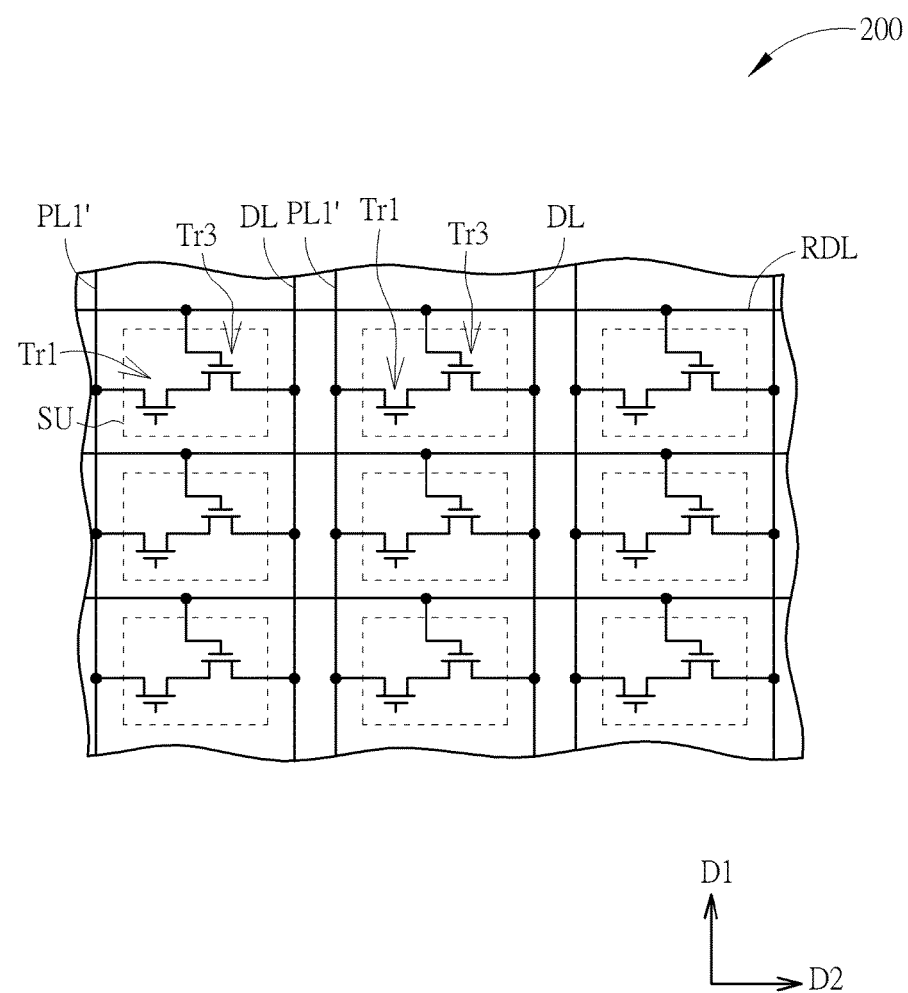
FIG. 12 is a schematic diagram illustrating a top view of a sensor device according to a second embodiment of the present disclosure.

Please refer to FIG. 12, which is a schematic diagram illustrating a top view of a sensor device according to a second embodiment of the present disclosure. As shown in FIG. 12, compared to the first embodiment, different sensor units SU connected to the same readout line RDL are coupled to different first power line PL1' in this embodiment. In the sensor device 200 of this embodiment, each first power line PL1' and each data line DL may extend along the first direction D1 respectively, and each readout line RDL may extend along the second direction D2, so that the extension direction of each first power line PL1' is different from the extension direction of each readout line RDL. For example, the first direction D1 may be perpendicular to the second direction D2, but not limited thereto. Taking two sensor units SU adjacent to each other as an example, the third gates of two third transistors Tr3 are coupled to the same readout line RDL, but two third sources of the third transistors Tr3 are coupled to different data lines DL, and the first drains of the first transistors Tr1 are coupled to different first power lines PL1' respectively. Since different sensor units SU connected to the same readout line RDL are coupled to different first power line PL1', the load effect generated in the first power lines PL1' can be mitigated or prevented when the third transistors Tr3 in the same row are turned on at the same time, so as to mitigate uneven first voltages provided from the first power lines PL1' to the different sensor units SU. Thus, the detection uniformity and accuracy of the sensor device 200 can be improved, or the SN ratio of the sensor device 200 can be raised.

Figure 13:
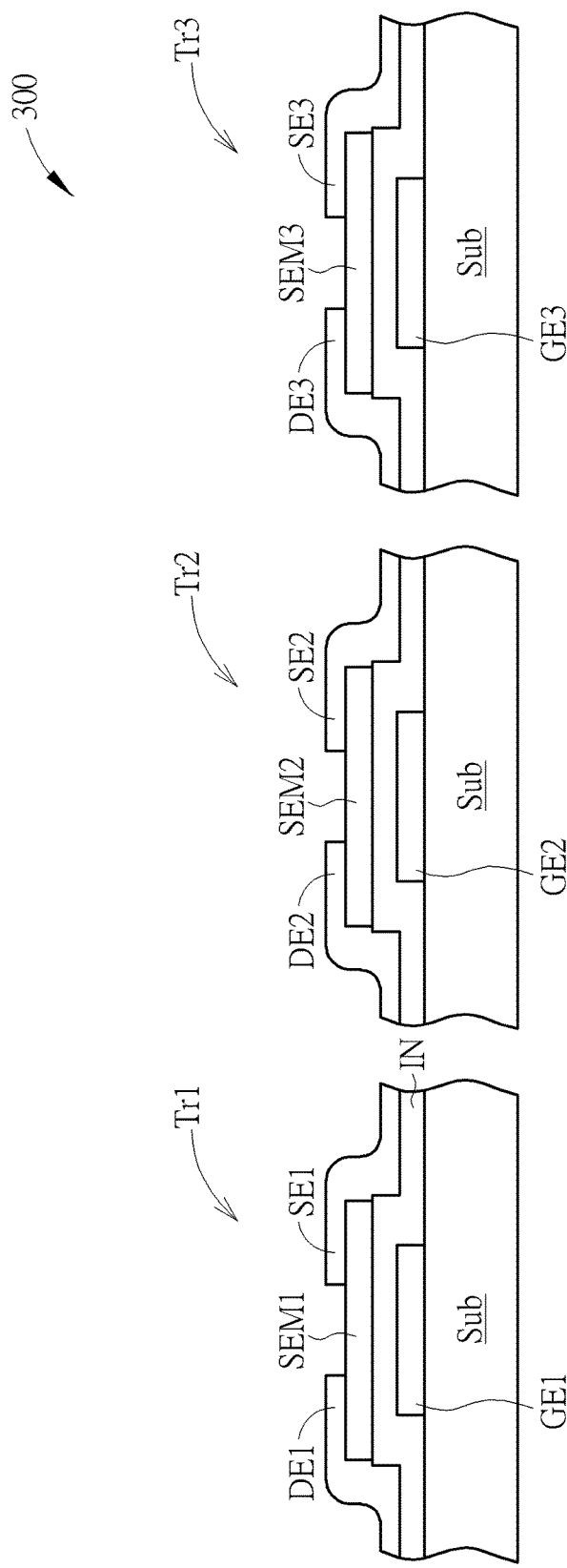
FIG. 13 is a schematic diagram illustrating a cross-sectional view of a sensor device according to a third embodiment of the present disclosure.

Please refer to FIG. 13, which is a schematic diagram illustrating a cross-sectional view of a sensor device according to a third embodiment of the present disclosure. In the sensor device 300 of this embodiment, the second transistor Tr2 may further include a second semiconductor layer SEM2, and the third transistor Tr3 may further include a third semiconductor layer SEM3. At least one of the first semiconductor layer SEM1, the second semiconductor layer SEM2 and the third semiconductor layer SEM3 includes poly-silicon, and at least another one of the first semiconductor layer SEM1, the second semiconductor layer SEM2 and the third semiconductor layer SEM3 includes oxide semiconductor or amorphous silicon. Or, at least one of the first semiconductor layer SEM1, the second semiconductor layer SEM2 and the third semiconductor layer SEM3 includes oxide semiconductor. Specifically refer to Table 1, which lists combinations of materials suitable for the first semiconductor layer SEM1, the second semiconductor layer SEM2 and the third semiconductor layer SEM3 in the present disclosure. For example, when at least one of the first semiconductor layer SEM1, the second semiconductor layer SEM2 and the third semiconductor layer SEM3 includes oxide semiconductor, the other two of the first semiconductor layer SEM1, the second semiconductor layer SEM2 and the third semiconductor layer SEM3 may include oxide semiconductor or amorphous silicon. The first transistor Tr1, the second transistor Tr2 and the third transistor Tr3 of the present disclosure are not limited to be the bottom gate type transistor as shown in FIG. 13, and the first transistor Tr1, the second transistor Tr2 and the third transistor Tr3 of the present disclosure may selectively be the top gate transistor as shown in FIG. 7B, respectively. For example, when the first semiconductor layer SEM1 includes poly-silicon, the first transistor Tr1 may be the top gate type transistor as shown in FIG. 7B, and when the second semiconductor layer SEM2 includes oxide semiconductor or amorphous silicon, the second transistor Tr2 may be bottom gate type transistor. Or, when the third semiconductor layer SEM3 includes poly-silicon, the third transistor Tr3 may be the top gate type transistor as shown in FIG. 7B, and when the second semiconductor layer SEM2 includes oxide semiconductor or amorphous silicon, the second transistor Tr2 may be the bottom gate type transistor.

TABLE 1

| first semiconductor layer | second semiconductor layer | third semiconductor layer |
|---|---|---|
| poly-silicon | poly-silicon | amorphous silicon |
| poly-silicon | poly-silicon | oxide semiconductor |
| poly-silicon | amorphous silicon | amorphous silicon |
| poly-silicon | amorphous silicon | poly-silicon |
| poly-silicon | amorphous silicon | oxide semiconductor |
| poly-silicon | oxide semiconductor | oxide semiconductor |
| poly-silicon | oxide semiconductor | poly-silicon |
| poly-silicon | oxide semiconductor | amorphous silicon |
| oxide semiconductor | oxide semiconductor | oxide semiconductor |
| oxide semiconductor | oxide semiconductor | poly-silicon |
| oxide semiconductor | oxide semiconductor | amorphous silicon |
| oxide semiconductor | poly-silicon | poly-silicon |
| oxide semiconductor | poly-silicon | oxide semiconductor |
| oxide semiconductor | poly-silicon | amorphous silicon |
| oxide semiconductor | amorphous silicon | amorphous silicon |
| oxide semiconductor | amorphous silicon | poly-silicon |
| oxide semiconductor | amorphous silicon | oxide semiconductor |
| amorphous silicon | amorphous silicon | poly-silicon |
| amorphous silicon | amorphous silicon | oxide semiconductor |
| amorphous silicon | poly-silicon | poly-silicon |
| amorphous silicon | poly-silicon | oxide semiconductor |
| amorphous silicon | poly-silicon | amorphous silicon |
| amorphous silicon | oxide semiconductor | oxide semiconductor |
| amorphous silicon | oxide semiconductor | poly-silicon |
| amorphous silicon | oxide semiconductor | amorphous silicon |

The following description takes the first semiconductor layer including poly-silicon and the second semiconductor layer SEM2 and the third semiconductor layer SEM3 including oxide semiconductor or amorphous silicon respectively as an example. A gain formula (2) of a transistor is shown as follow:

$$G = \mu \frac{Wch}{Lch} \frac{Cox}{C2} (Vg - Vth) \text{Tread}, \qquad (2)$$

where G is value of the gain of the transistor, C2 is value of a capacitance of the second parasitic capacitor, and Tread is value of a time length of the readout period. As seen from the formula (2), the gain of the transistor and the carrier mobility of the semiconductor layer used as the channel region are directly proportional to each other. It should be noted that since the first transistor Tr1 is operated in the saturation region, there is no need to take the switch characteristic into account, and the gain of the first transistor Tr1 may be increased through poly-silicon having the carrier mobility greater than oxide semiconductor and amorphous silicon, so as to raise the sensitivity for detecting the light intensity and increase the SN ratio of the sensor device 300. Furthermore, since the second transistor Tr2 and the third transistor Tr3 require performing switch function, oxide semiconductor or amorphous silicon which have current leakage less than poly-silicon while the transistor is turned off can be applied to the second semiconductor layer SEM2 and the third semiconductor layer SEM3 to reduce uncertainty of detecting light intensity and error rate of reading the drain current Id of the first transistor Tr1. As the above-mentioned, in the sensor device 300 of this embodiment, through differentiating the material of the first semiconductor layer SEM1 from the materials of the semiconductor layer SEM2 and the third semiconductor layer SEM3, the SN ratio can be increased, or the detection error rate can be reduced.

In summary, in the sensor device of the present disclosure, the SN ratio and detection accuracy of the sensor device can be effectively increased through designing the first transistor to be the asymmetric transistor, coupling different sensor units connected to the same readout line to different first power lines, and differentiating the material of the first semiconductor layer from the materials of the second semiconductor layer and the third semiconductor layer.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A sensor device, comprising:
   a readout line;
   a data line;
   a first power line, crossing and being perpendicular to the readout line;

a second power line;
a bias line; and
a sensor unit, comprising:
    a first transistor, having a first gate, a first drain, and a first source, wherein the first drain is coupled to the first power line, the first drain has a concave surface, and the first source is disposed corresponding to the concave surface;
    a second transistor, having a second gate, a second drain, and a second source, wherein the second source is coupled to the first gate, and the second drain is coupled to the second power line;
    a third transistor, having a third gate, a third drain, and a third source, wherein the third drain is coupled to the first source, the third source is coupled to the data line, and the third gate is coupled to the readout line; and
    a photosensor, having an anode and a cathode, wherein the anode is coupled to the first gate and the second source, and the cathode is coupled to the bias line,
    wherein a voltage of the bias line is greater than a voltage of the second power line.

2. The sensor device according to claim 1, further comprising a reset line, and the second gate being coupled to the reset line.

3. The sensor device according to claim 1, further comprising a capacitor coupled to the anode and the bias line.

4. The sensor device according to claim 1, wherein the concave surface comprises a concave part, and the first source overlaps the concave part in a top view direction.

5. The sensor device according to claim 1, wherein the first transistor further comprises a first semiconductor layer, the second transistor further comprises a second semiconductor layer, the third transistor further comprises a third semiconductor layer, wherein at least one of the first semiconductor layer, the second semiconductor layer and the third semiconductor layer comprises poly-silicon, and at least another one of the first semiconductor layer, the second semiconductor layer and the third semiconductor layer comprises oxide semiconductor or amorphous silicon.

6. The sensor device according to claim 1, wherein the first transistor further comprises a first semiconductor layer, the second transistor further comprises a second semiconductor layer, the third transistor further comprises a third semiconductor layer, wherein at least one of the first semiconductor layer, the second semiconductor layer and the third semiconductor layer comprises oxide semiconductor.

7. The sensor device according to claim 1, wherein the data line is parallel to the first power line, and the data line crosses the readout line.

8. The sensor device according to claim 1, wherein the first transistor further comprises a first semiconductor layer, the second transistor further comprises a second semiconductor layer, the third transistor further comprises a third semiconductor layer, at least one of the first semiconductor layer, the second semiconductor layer, and the third semiconductor layer is partially overlapped with a corresponding one of the first gate, the second gate, or the third gate.

9. The sensor device according to claim 1, wherein the concave surface comprises a concave part, and the first source does not overlaps the concave part in a top view direction.

10. A sensor device, comprising:
a readout line;
a data line;
a first power line, crossing and being perpendicular to the readout line;
a second power line;
a bias line; and
a sensor unit, comprising:
    a first transistor, having a first gate, a first drain, a first source, and a first semiconductor layer, wherein the first drain is coupled to the first power line;
    a second transistor, having a second gate, a second drain, a second source, and a second semiconductor layer, wherein the second source is coupled to the first gate, and the second drain is coupled to the second power line;
    a third transistor, having a third gate, a third drain, a third source, and a third semiconductor layer, wherein the third drain is coupled to the first source, the third source is coupled to the data line, and the third gate is coupled to the readout line; and
    a photosensor, having an anode and a cathode, wherein the anode is coupled to the first gate and the second source, and the cathode is coupled to the bias line,
    wherein a voltage of the bias line is greater than a voltage of the second power line,
    wherein at least one of the first semiconductor layer, the second semiconductor layer and the third semiconductor layer comprises poly-silicon, and at least another one of the first semiconductor layer, the second semiconductor layer and the third semiconductor layer comprises oxide semiconductor or amorphous silicon.

11. The sensor device according to claim 10, wherein the first semiconductor layer comprises poly-silicon, and the second semiconductor layer comprises oxide semiconductor or amorphous silicon.

12. The sensor device according to claim 10, wherein the third semiconductor layer comprises poly-silicon and the second semiconductor layer comprises oxide semiconductor or amorphous silicon.

13. The sensor device according to claim 10, further comprising a reset line, wherein the second gate is coupled to the reset line.

14. The sensor device according to claim 13, further comprising a capacitor coupled to the anode and the bias line.

15. The sensor device according to claim 10, wherein the data line is parallel to the first power line, and the data line crosses the readout line.

16. The sensor device according to claim 10, wherein at least one of the first semiconductor layer, the second semiconductor layer, and the third semiconductor layer is partially overlapped with a corresponding one of the first gate, the second gate, or the third gate.

17. A sensor device, comprising:
a readout line;
a data line;
a first power line, crossing and being perpendicular to the readout line;
a second power line;
a bias line; and
a sensor unit, comprising:
    a first transistor, having a first gate, a first drain, a first source, and a first semiconductor layer, wherein the first drain is coupled to the first power line;
    a second transistor, having a second gate, a second drain, a second source, and a second semiconductor layer, wherein the second source is coupled to the first gate, and the second drain is coupled to the second power line;

a third transistor, having a third gate, a third drain, a third source, and a third semiconductor layer, wherein the third drain is coupled to the first source, the third source is coupled to the data line, and the third gate is coupled to the readout line; and a photosensor, having an anode and a cathode, wherein the anode is coupled to the first gate and the second source, and the cathode is coupled to the bias line, wherein a voltage of the bias line is greater than a voltage of the second power line, wherein at least one of the first semiconductor layer, the second semiconductor layer and the third semiconductor layer comprises oxide semiconductor.

18. The sensor device according to claim 17, wherein the second semiconductor layer comprises oxide semiconductor, and another two of the first semiconductor layer, the second semiconductor layer and the third semiconductor layer comprise oxide semiconductor or amorphous silicon.

19. The sensor device according to claim 17, further comprising a reset line, wherein the second gate is coupled to the reset line.

20. The sensor device according to claim 19, further comprising a capacitor coupled to the anode and the bias line.

21. The sensor device according to claim 17, wherein the data line is parallel to the first power line, and the data line crosses the readout line.

22. The sensor device according to claim 17, wherein at least one of the first semiconductor layer, the second semiconductor layer, and the third semiconductor layer is partially overlapped with a corresponding one of the first gate, the second gate, or the third gate.

* * * * *